US012787626B2

(12) United States Patent
Chin et al.

(10) Patent No.: US 12,787,626 B2
(45) Date of Patent: Nov. 3, 2026

(54) METHOD OF MANUFACTURING A PEROVSKITE PHOTOVOLTAIC CELL

(71) Applicant: CSEM Centre Suisse d'Electronique et de Microtechnique SA—Recherche et Développement, Neuchâtel (CH)

(72) Inventors: Xin Yu Chin, Neuchâtel (CH); Quentin Jeangros, Renens (CH)

(73) Assignee: CSEM CENTRE SUISSE D'ELECTRONIQUE ET DE MICROTECHNIQUE SA—RECHERCHE ET DÉVELOPPEMENT, Neuchatel (CH)

( * ) Notice: Subject to any disclaimer, the term of this patent is extended or adjusted under 35 U.S.C. 154(b) by 366 days.

(21) Appl. No.: 18/523,279

(22) Filed: Nov. 29, 2023

(65) Prior Publication Data

US 2024/0180012 A1 May 30, 2024

(30) Foreign Application Priority Data

Nov. 30, 2022 (EP) .................................... 22210577

(51) Int. Cl.
*H10K 71/12* (2023.01)
*H10K 30/10* (2023.01)
(Continued)

(52) U.S. Cl.
CPC ............. *H10K 71/12* (2023.02); *H10K 30/10* (2023.02); *H10K 30/50* (2023.02); *H10K 85/211* (2023.02);
(Continued)

(58) Field of Classification Search
CPC ........ H10K 71/12; H10K 30/10; H10K 30/50; H10K 85/211; H10K 85/50; H10K 85/60;
(Continued)

(56) References Cited

U.S. PATENT DOCUMENTS

2012/0312364 A1* 12/2012 Uhrich .................. H10K 30/40 136/255
2014/0332789 A1* 11/2014 Dorok .................... H10K 50/10 257/40
(Continued)

FOREIGN PATENT DOCUMENTS

CN 111816772 A 10/2020
CN 113629196 A 11/2021
(Continued)

OTHER PUBLICATIONS

"Improved performance and stability of perovskite solar cells by crystal crosslinking with alkylphosphonic acid ω-ammonium chlorides", Xiang Li et al., Nature Chemistry, pp. 703-710, vol. 7, Aug. 17, 2015 (Year: 2015).*
(Continued)

*Primary Examiner* — S M Sohel Imtiaz
(74) *Attorney, Agent, or Firm* — NIXON & VANDERHYE

(57) ABSTRACT

A method of manufacturing a solar cell includes: providing a substrate; providing a first layer of transparent conductive oxide on the substrate; providing a first charge transport layer on the first layer of transparent conductive oxide; providing a perovskite-based light-absorber layer on the first charge transport layer; providing a second charge transport layer on the perovskite-based light absorber layer; providing a second layer of transparent conductive oxide on the second charge transport layer; providing a patterned metallic contact layer on the second layer of transparent conductive oxide. The step of providing a perovskite-based light absorber layer includes: providing a perovskite precursor solution including an additive including an organic phosphonic acid and/or a phosphonate salt in a concentration of 0.1 mMol-50 mMol in the perovskite precursor solution;
(Continued)

applying the perovskite precursor solution upon the first charge transport layer; annealing the perovskite layer at 100-170° C.

13 Claims, 7 Drawing Sheets

(51) Int. Cl.

| | |
|---|---|
| ***H10K 30/50*** | (2023.01) |
| *H10K 85/20* | (2023.01) |
| *H10K 85/50* | (2023.01) |
| *H10K 85/60* | (2023.01) |

(52) U.S. Cl.
CPC ............. *H10K 85/50* (2023.02); *H10K 85/60* (2023.02); *H10K 85/624* (2023.02); *H10K 85/633* (2023.02); *H10K 85/653* (2023.02); *H10K 85/6572* (2023.02)

(58) Field of Classification Search
CPC .... H10K 30/211; H10K 30/40; Y02E 10/549; H10F 10/14; H10F 10/17
See application file for complete search history.

(56) References Cited

U.S. PATENT DOCUMENTS

| | | | | |
|---|---|---|---|---|
| 2016/0233439 | A1* | 8/2016 | Burschka | H10K 85/50 |
| 2018/0174762 | A1* | 6/2018 | Kim | H10K 85/50 |
| 2018/0248052 | A1* | 8/2018 | Seok | H10F 77/211 |
| 2018/0331300 | A1* | 11/2018 | Fadhel | H10K 85/657 |
| 2019/0221742 | A1* | 7/2019 | Li | H10K 85/30 |
| 2024/0081144 | A1* | 3/2024 | Gao | H10K 85/633 |
| 2024/0138163 | A1* | 4/2024 | Berry | H10K 30/86 |
| 2024/0251574 | A1* | 7/2024 | Schmager | H10K 85/50 |
| 2024/0373656 | A1* | 11/2024 | Wojciechowski | H10K 30/86 |

FOREIGN PATENT DOCUMENTS

| | | | |
|---|---|---|---|
| CN | 114497426 | A | 5/2022 |
| CN | 114744128 | A | 7/2022 |
| WO | 2015092397 | A1 | 6/2015 |

OTHER PUBLICATIONS

"Recent progress and future prospects of perovskite tandem solar cells", Anita W. Y. Ho-Baillie et al., Appl. Phys. Rev. 8, 041307, Oct. 15, 2021 (Year: 2021).*

Search Report for EP Application No. 22 21 0577 dated Apr. 24, 2023, 11 pages.

Akman Erdi et al., "Moisture-Resistant FAPbl3 Perovskite Solar Cell with 22.25% Power Conversion Efficiency through Pentafluorobenzyl Phosphonic Acid Passivation", CHEMSUSCHEM, vol. 14, No. 4, Jan. 19, 2021, pp. 1176-1183.

Sung Sae Jin et al., "Molecular Engineering for Function-Tailored Interface Modifier in High-Performance Perovskite Solar Cells", Advanced Energy Materials, vol. 12, No. 27, May 30, 2022, 10 pages.

Li Xiong et al., "Improved performance and stability of perovskite solar cells by crystal crosslinking with alkylphosphonic acid [omega]-ammonium chlorides", Nature Chemistry, vol. 7, No. 9, Aug. 17, 2015, pp. 703-711.

Ho-Baillie Anita W. Y. et al., "Recent progress and future prospects of perovskite tandem solar cells", Applied Physics Reviews, vol. 8, No. 4, Oct. 15, 2021, 26 pages.

Liu & Kelly, "Perovskite solar cells with a planar heterojunction structure prepared using room-temperature solution processing techniques", Nature Photonics 8, 2014, pp. 133-138 [Submission Pending].

Tockorn et al, "Nano-optical designs for high-efficiency monolithic perovskite-silicon tandem solar cells", Nature Nanotechnology, 17(11), pp. 1214-1221.

F. Sahli et al., "Fully textured monolithic perovskite/silicon tandem solar cells with 25.2% power conversion efficiency", Nat. Mater. 17, 2018, pp. 820-826 [Submission Pending].

Saliba, M. et al., "How to Make over 20% Efficient Perovskite Solar Cells in Regular ( n-i-p ) and Inverted ( p-i-n ) Architectures", Chemistry of Materials, 30(13), 2018, pp. 4193-4201.

* cited by examiner

METHOD OF MANUFACTURING A PEROVSKITE PHOTOVOLTAIC CELL

CROSS-REFERENCE TO RELATED APPLICATIONS

This application claims priority to EP 22210577.7 filed Nov. 30, 2022, the entire contents of which are hereby incorporated by reference.

TECHNICAL FIELD

The present invention relates to the field of photovoltaic devices. More particularly, it relates to a method of manufacture of a perovskite-based photovoltaic cell.

STATE OF THE ART

Recently, photovoltaic devices (PV devices) based on so-called perovskite absorber layers have been showing promise as an alternative or complement to conventional crystalline and thin-film silicon-based PV devices. "Perovskites" are organometallic halide materials with a formula generically written as $ABX_3$, where A is an inorganic or organic cation such as Cs, $CH_3NH_3$ or $HC(NH_2)_2$, B is a metal such as tin or lead, and X is a halogen atom such as iodine, bromine or chlorine. Examples of such materials are methylammonium lead trihalide ($CH_3NH_3PbX_3$), Caesium formamidinum lead trihalide ($CsH_2NCHNH_2PbX_3$), and methylammonium tin triiodide (CH3NH3SnI3). These compounds adopt a similar crystal structure to calcium titanium oxide ($CaTiO_3$) and, when illuminated, generate electron-hole pairs, which can be separated by sandwiching the perovskite absorber layer between an electron transporting n-type layer and a hole-transporting p-type layer, with the perovskite serving as the intrinsic (i) layer so as to form a PIN or NIP junction, analogous to its silicon counterpart.

Such perovskite-based cells can be used as single-junction cells, or can be combined with a silicon cell to create a tandem PV device, the perovskite junction being located on the light-incident side of the cell.

The perovskite layer itself is typically deposited in a wet process, such as wet coating followed by evaporation of the carrier solvent, although vapour deposition techniques are also showing promise. An example of room-temperature solution deposition of perovskite is disclosed in Liu & Kelly, "*Perovskite solar cells with a planar heterojunction structure prepared using room-temperature solution processing techniques*" Nature Photonics 8, 133-138 (2014).

Efficiencies of over 25% have been reported with perovskite single junctions, while perovskite/silicon tandems reach 29% in the literature, such as the 29.8% reported by Tockorn et al, "Nano-optical designs for high-efficiency monolithic perovskite-silicon tandem solar cells", *Nature Nanotechnology,* 17(11), 1214-1221. http://doi.org/10.1038/s41565-022-01228-8.

However, Perovskite solar cells are typically limited in performance by i) charge carrier transport losses occurring within the perovskite absorber when reaching a perovskite layer thickness approaching the micrometre scale (that is on the same order of magnitude as the electron and hole diffusion lengths), and ii) by defects that form at the interfaces between the perovskite and the charge carrier selective layers. These voltage losses can be mitigated i) by adapting deposition conditions to yield a perovskite microstructure exhibiting large grains that span across the full perovskite layer thickness, and ii) by developing surface-treatment materials that coordinate with the perovskite surface defects and hence passivate them.

The microstructure of the perovskite layer can be tuned using a variety of approaches, from fine-tuning the deposition conditions to the use of growth-modulating agents in the perovskite deposition process. The passivation of surface defects is typically achieved by a separate processing step treat an already existing perovskite layer.

From the scientific literature, phosphonic acids have been used to passivate perovskite solar cells when deposited as a separate, additional step on the perovskite absorber surface, see E. Akman, A. E. Shalan, F. Sadegh, S. Akin, "*Moisture-Resistant FAPbI*3 *Perovskite Solar Cell with* 22.25% *Power Conversion Efficiency through Pentafluorobenzyl Phosphonic Acid Passivation*" *ChemSusChem.* 14, 1176-1183 (2021). Although this provides excellent passivation, it requires extra processing steps.

Document CN113629196 describes a method of depositing perovskite layers in which phosphonic acids are incorporated in a $FA_{0.85}Cs_{0.15}PbI_3$ perovskite precursor solution applied to the underlying layer of the PV cell by a 1-step spin coating approach as part of the fabrication of an n-i-p configuration photovoltaic cell, followed by annealing for 20 minutes at a temperature of 200° C. The approach enables stabilizing the photoactive $FA_{0.85}Cs_{0.15}PbI_3$ and leads to a chemical modification of the bulk of the perovskite, as highlighted by a shift in bandgap and a larger light absorption range. The relatively high curing temperature used is not suitable for a wide range of perovskite materials as it may lead to their decomposition, which is undesirable.

The aim of the present invention is hence to at least partially overcome the limitations of the prior art.

DISCLOSURE OF THE INVENTION

More precisely, the invention relates to a method of manufacturing a solar cell, as defined in independent claim 1. This method comprises at least steps of (further intermediate steps not being excluded):

- providing a substrate, which may be an opaque support (e.g. of metal), a transparent support (e.g. of glass, sapphire, transparent polymer or similar) or a silicon solar cell (e.g. a so-called "bottom cell", such that the solar cell of the invention is a tandem cell);
- providing a first layer of transparent conductive oxide directly or indirectly on said substrate;
- providing a first charge transport layer directly or indirectly on said first layer of transparent conductive oxide;
- providing a perovskite-based light-absorber layer directly or indirectly on said first charge transport layer;
- providing a second charge transport layer directly or indirectly on said perovskite-based light absorber layer;
- providing a second layer of transparent conductive oxide directly or indirectly on said second charge transport layer, this typically (but not necessarily) being indirectly provided on the second charge transport layer with a buffer layer (e.g. of atomic layer deposited tin oxide) provided between the two:
- providing a patterned metallic contact layer directly or indirectly on said second layer of transparent conductive oxide.

According to the invention, said step of providing a perovskite-based light absorber layer comprises:

- providing a perovskite precursor solution comprising an additive comprising an organic phosphonic acid and/or phosphonate salt in a concentration of between 0.1 mMol and 50 mMol, preferably between 1 mMol and 10 mMol depending on the solution, considering the additive with respect to the entirety of the precursor solution;

applying said perovskite precursor solution directly or indirectly upon said first charge transport layer;

annealing said perovskite layer at a temperature between 100° C. and 170° C.

This additive has been shown to, without requiring any extra fabrication steps:

increase the fill factor of the solar cell due to improved crystallinity of the perovskite-based light-absorber layer with larger crystal grains, resulting in fewer grain boundaries along the travel direction of the charge carriers;

improve passivation by binding with Pb-related defects at the top surface of the perovskite-based light-absorber layer, thereby notably increasing the open circuit voltage.

Advantageously, said first charge transport layer is a hole selective layer comprising one of:

2,2',7,7'-Tetra(N,N-di-p-tolyl)amino-9,9-spirobifluorene (spiro-TTB);

1,3,4,6-Tetra-O-acetyl-2-O-(trifluoromethanesulfonyl)-beta-D-mannopyranose (TaTm);

3,6-dimethyl-9H-carbazol-9-yl)butyl]phosphonic acid (Me-4PACz).

[2-(3,6-dimethoxy-9H-carbazol-9-yl)ethyl]phosphonic acid (MeO-2PACz)

[2-(9H-carbazol-9-yl)ethyl]phosphonic acid (2PACz)

Other suitable materials are possible for the first charge transport layer.

Advantageously, said second charge transport layer typically comprises carbon-60.

Advantageously, said additive comprises one or more of: 2,3,4,5,6-pentafluorobenzylphosphonic acid, benzylphosphonic acid, 4-bromobenzylphosphonic acid, 4-fluorobenzylphosphonic acid, (4-chlorophenyl)phosphonic acid, phenylphosphonic acid.

Advantageously, said perovskite-based light-absorber layer has a thickness between 200 nm and 2000 nm, preferably from 500 to 1500 nm.

Advantageously, said perovskite-based light absorber layer comprises $(Cs,FA,MA)Pb(I,Br,Cl)_3$ or $(Cs,FA)Pb(I,Br,Cl)_3$, preferably $Cs_{0.18}FA_{0.82}Pb(I,Br)_3$.

In a one-step deposition process, said perovskite precursor solution comprises organic and inorganic perovskite precursors and is applied directly to said first charge transport layer, i.e. as a single-step deposition. The exact nature of these precursors (such as lead halides ($PbI_2$, $PbBr_2$, $PbCl_2$), cesium halide (CsI, CsBr, CsCl), formamidinium halides (FAI, FABr, FACl) and methylammonium halides (MAI, MABr, MACl), of which $PbI_2$, FAI, $PbBr_2$, FABr, MABr and CsI are preferred) are known to the skilled person and depend on the type of perovskite used for the perovskite-based light absorber layer. In this case, the concentration of said additive in said perovskite precursor solution is preferably 0.1-50 mMol, preferably between 1 and 10 mMol. Furthermore, said substrate may have a roughness of less than 1 μm Ra on a surface facing said perovskite-based light absorber layer.

In a two-step deposition process, step of providing a perovskite-based light absorber layer comprises a step of vapour depositing a layer of CsX and/or $PbX_2$, where X is I, Br or Cl directly or indirectly on said first charge transport layer followed by said step of applying said perovskite precursor solution. In such a case, said perovskite precursor solution comprises organic perovskite precursors (such as those mentioned above) and is exempt from inorganic perovskite precursors since these were already deposited in the vapour deposition step. In such a case, or indeed also in the case of one-step deposition, said substrate may have a roughness of 0 μm to 10 μm Ra, preferably 2 μm to 10 μm Ra on a surface facing said perovskite-based light absorber layer. Again, the concentration of said additive in said perovskite precursor solution may be from 0.1 mMol to 50 mMol.

The aforementioned variants, advantageous features etc. can be combined in any way which makes technical sense.

BRIEF DESCRIPTION OF THE FIGURES

Further details of the description will become clearer upon reading the following description in conjunction with the annexed figures, in which.

EMBODIMENTS OF THE INVENTION

Figure 1:
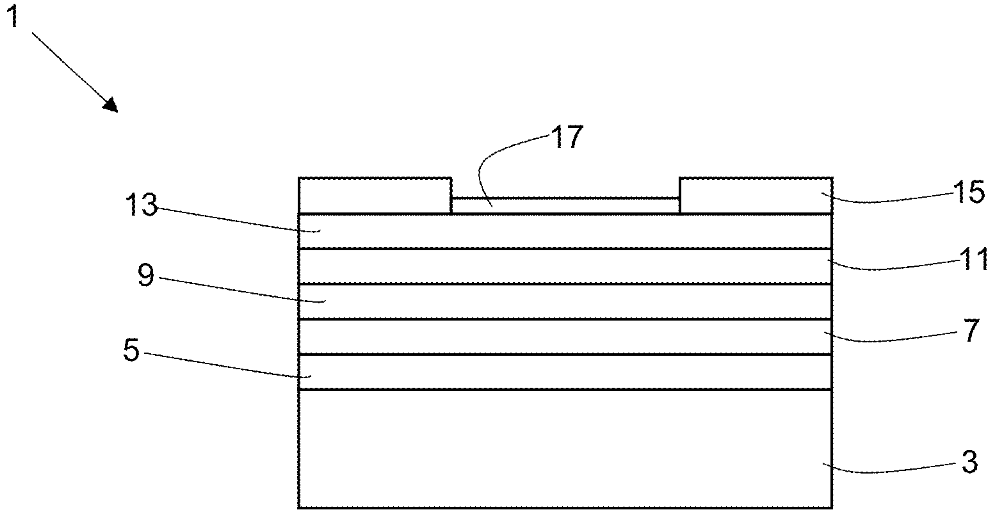
FIG. 1 is a schematic representation of a solar cell produced by the method of the invention.
Figure 1A:
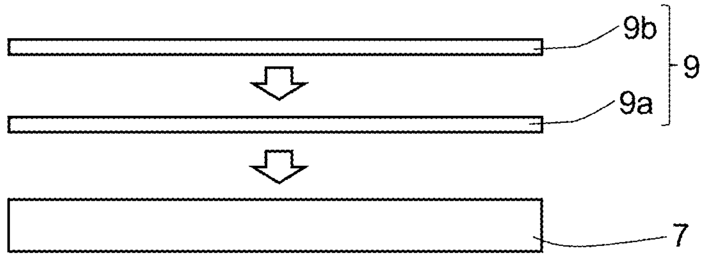
FIG. 1*a* is a partial schematic representation of two-step deposition of the perovskite-based light absorber layer on the first charge transport layer.

FIG. 1 schematically illustrates a solar cell 1 (i.e. a photovoltaic cell) produced by the method of the invention. This can be a single junction perovskite cell, in which case substrate 3 is an opaque or transparent support layer such as glass or metal, or a tandem cell, in which substrate 3 is a bottom cell such as (but not limited to) a conventional silicon cell such as a crystalline silicon cell. The upper surface of the substrate 3 may be textured, as is generally known and which will be discussed further below.

In the foregoing, it should be noted that each layer can be directly deposited on the previously-formed layer, or may be indirectly deposited thereupon with an intervening layer in between, and the method proceeds from bottom to top in the orientation of FIG. 1.

Upon the substrate 3, the cell 1 comprises a first transparent conductive oxide layer 5, such as indium tin oxide (ITO), zinc oxide, indium zinc oxide (IZO) or similar. First transparent conductive oxide layer 5 may be doped or undoped.

Upon the first transparent conductive oxide layer 5, a first charge transport layer 7 is deposited. This is either a hole transport (p-type) or an electron transport (n-type) layer, of an applicable type as is generally known in the field of perovskite photovoltaic cells. In the case of a hole transport layer (HTL), spiro-TTB (2,2',7,7'-Tetra(N,N-di-p-tolyl)amino-9,9-spirobifluorene), TaTM (1,3,4,6-Tetra-O-acetyl-2-O-(trifluoromethanesulfonyl)-beta-D-mannopyranose) Me-4PACz (4-(3,6-dimethyl-9H-carbazol-9-yl)butyl]phosphonic acid), -[2-(3,6-dimethoxy-9H-carbazol-9-yl)ethyl] phosphonic acid (MeO-2PACz) or [2-(9H-carbazol-9-yl) ethyl]phosphonic acid (2PACz) are typically used.

Upon the first charge transport layer is deposited a perovskite-based light absorber layer 9 (which can be abbreviated to "perovskite layer 9" in the context of the present specification), the deposition of which forms the key to the invention as will become more apparent below. This perovskite is typically based on the generic formulae (Cs,FA,MA) $Pb(I,Br,Cl)_3$ or $(Cs,FA)Pb(I,Br,Cl)_3$. Other types of perovskite material are however possible.

Upon the perovskite layer 9 is deposited a second charge transport layer 11, of the opposite type to the first charge transport layer 7. This is typically an electron transport layer (ETL) based on carbon-60.

Upon second charge transport layer 11 is deposited a second layer of transparent conductive oxide 13, which may be a single layer or a multilayer of two different materials, such as one or more of doped or undoped tin oxide, indium tin oxide, indium zinc oxide or similar. Upon this layer is deposited a patterned metallic contact layer 15 which may comprise is screen-printed silver paste, vapour-deposited copper, or similar, and is typically patterned. A further layer 17 (or indeed layers), such as anti-reflection layers, can also be deposited on top of the second layer of transparent conductive oxide 13 in the interstices between the patterned metallic contacts 15. A non-illustrated buffer layer of e.g. atomic layer deposited $SnO_2$ may be deposited between the second charge transport layer 12 and the second layer of transparent conductive oxide 13.

However, these examples of materials for the various layers are not to be held as limiting, and the full panoply of suitable materials can be used, as is generally known in the art, provided that the processing temperatures of the layers 11, 13 and 15 deposited after the perovskite layer 9 do not negatively influence this latter.

The deposition of the perovskite layer 9 will now be discussed in detail.

This layer 9 is deposited either in a one-step solution deposition process, or in a two-step process such as that described in F. Sahli, J. Werner, B. A. Kamino, M. Brsuninger, R. Monnard, B. Paviet-Salomon, L. Barraud, L. Ding, J. J. Diaz Leon, D. Sacchetto, G. Cattaneo, M. Despeisse, M. Boccard, S. Nicolay, Q. Jeangros, B. Niesen, C. Ballif, "*Fully textured monolithic perovskite/silicon tandem solar cells with* 252% *power conversion efficiency*", Nat. Mater. 17, 820-826 (2018), hereby incorporated by reference in its entirety. This two-step process involves a first step of co-evaporating a $CsBr/PbI_2$ template 9*a* directly or indirectly on the underlying layer, namely the first charge transport layer 7, and then solution-depositing the perovskite precursor 9*b* so as to form the perovskite layer 9.

In both deposition process, a perovskite precursor solution is provided, such precursors being e.g. lead halides ($PbX_2$, where X=1, Br or Cl), cesium halides (CsX, where X=1, Br or Cl) formamidinium halides (FAX, where X=1, Br or Cl) and methylammonium halides (MAX, where X=1, Br or Cl) in industry-typical concentrations (0.1 Mol to 2 Mol, see for instance Saliba, M., Correa-Baena, J.-P., Wolff, C. M., Stolterfoht, M., Phung, N., Albrecht, S., Neher, D., & Abate, A. (2018). "How to Make over 20% Efficient Perovskite Solar Cells in Regular (n-i-p) and Inverted (p-i-n) Architectures." Chemistry of Materials, 30(13), 4193-4201. https://doi.org/10.1021/acs.chemmater.8b00136), to which is added an additive comprising or consisting of an organic phosphonic acid or an organic phosphonate salt such that its concentration in the mixed precursor/additive solution is 0.1 mMol to 50 mMol, preferably 1 mMol to 10 mMol. Typically, 3-7 mMol, further typically substantially 5 mMol additive concentration is used for one-step and two-step depositions. The phosphonic acid or phosphonate salt is dissolved in one or more of a combination of polar and non-polar solvents (such as dimethylformamide (DMF) or dimethylsulfoxide (DMSO), or ethanol) and is added to the perovskite precursors (or, in the case of two-step deposition processes, only to the organic perovskite precursors) up to the desired concentration.

Such phosphonic acids have the general formula $R—PO_3H_2$, where R is any fully or partially fluorinated or non-fluorinated organic functional groups/molecules. A typical example which has shown good results is 2,3,4,5,6-pentafluorobenzylphosphonic acid (FBPAc), but other similar molecules are also possible, such as benzylphosphonic acid, 4-bromobenzylphosphonic acid, 4-fluorobenzylphosphonic acid, (4-chlorophenyl)phosphonic acid and phenylphosphonic acid. These additives may be used individually or in combination.

In the case of phosphonate salts, these have the general formula $R^1—PO(OR^2)(OR^3)$, where $R^1$ is again any fully or partially fluorinated or non-fluorinated organic functional groups/molecules, $R^2$ and $R^3$ are a cation such as $H^+$, $Cs^+$, $K^+$ or $FA^+$ (i.e. a formamidinium cation).

After application of the perovskite precursor solution to the surface of the first charge transport layer 7 by spin coating, dip coating, inkjet printing, meniscus coating, blade coating, slot-die coating, spray coating, or similar, the solvent is allowed to evaporate and the perovskite layer is annealed in ambient or inert gas environment at a temperature of between 100° C. and 170° C., preferably between 140° C. and 150° C.

The resulting final perovskite layer 9 thickness is between 200 nm and 2000 nm, preferably between 500 nm and 1500 nm.

In terms of the choice of one step or two step deposition, the former works best with a relatively lightly-textured underlying surface (i.e. the free surface of the first charge transport layer 7), with a roughness typically less than 1 μm Ra. The two-step deposition process, however, provides good results with relatively large textures, of the order of 1-10 μm Ra.

The additive tunes the growth of the perovskite layer 9, and segregates on the free surface of this layer during its crystallization to passivate defects and mitigate non-radiative surface recombination losses.

Experimental Results

To assess loss pathways triggered by non-radiative recombination, flat glass/indium tin oxide (ITO) substrates were first coated with a hole transport layer 7 (HTL), namely spiro-TTB, TaTM or Me-4PACz. These three materials were selected based on their compatibility with textured surfaces as the first two can be thermally evaporated, while the self-assembling properties (on ITO) of the latter should yield a conformal coating on textured surfaces. A perovskite thin film perovskite layer 9 of cesium formamidinium lead iodide bromide ($Cs_{0.18}FA_{0.82}Pb(I,Br)_3$) was deposited using the hybrid two-step deposition method referenced above. More precisely, a $CsBr/PbI_2$ template was co-evaporated on glass/ITO substrate, before spin coating an organo-halide solution (consisting of FABr and FAI in various ratios, in some cases with FBPAc). A thermal annealing step in ambient conditions at 150° C. then converted the films into a perovskite phase. In view of making tandem cells, a perovskite composition with an optical Eg of ~1.70 eV was selected.

Figure 2:
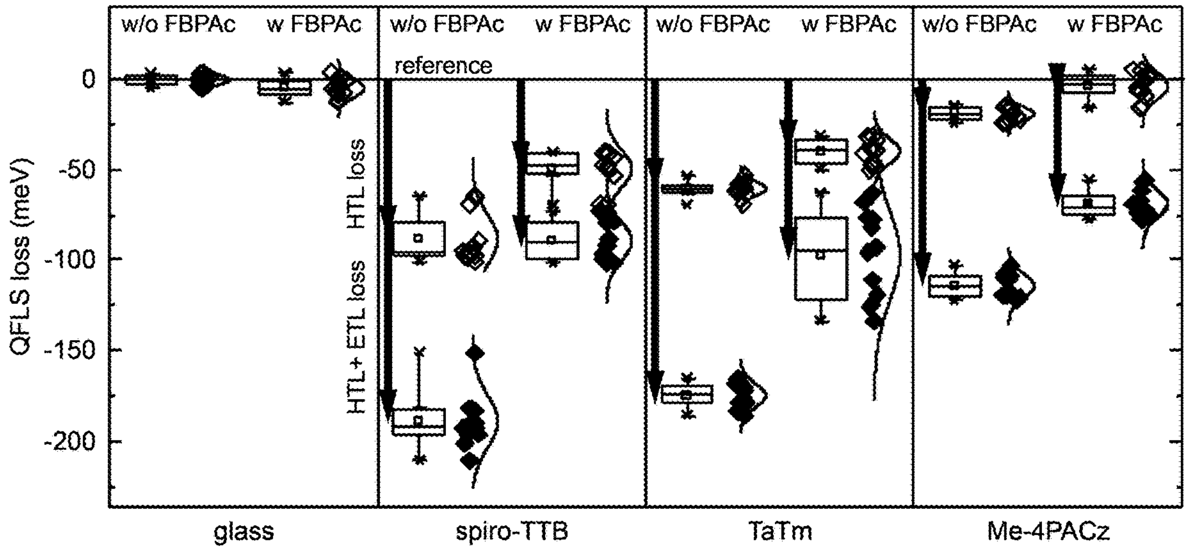
FIG. 2 is a graph of quasi Fermi-level splitting (QFLS) of bare perovskite layers deposited on glass, on a spiro-TTB hole transport layer (HTL), on a TaTm HTL, and on a Me-4PACz HTL, both with and without use of FBPAc additive, and both with or without use of a C60 electron transport layer (ETL) on the perovskite.
Figure 3:
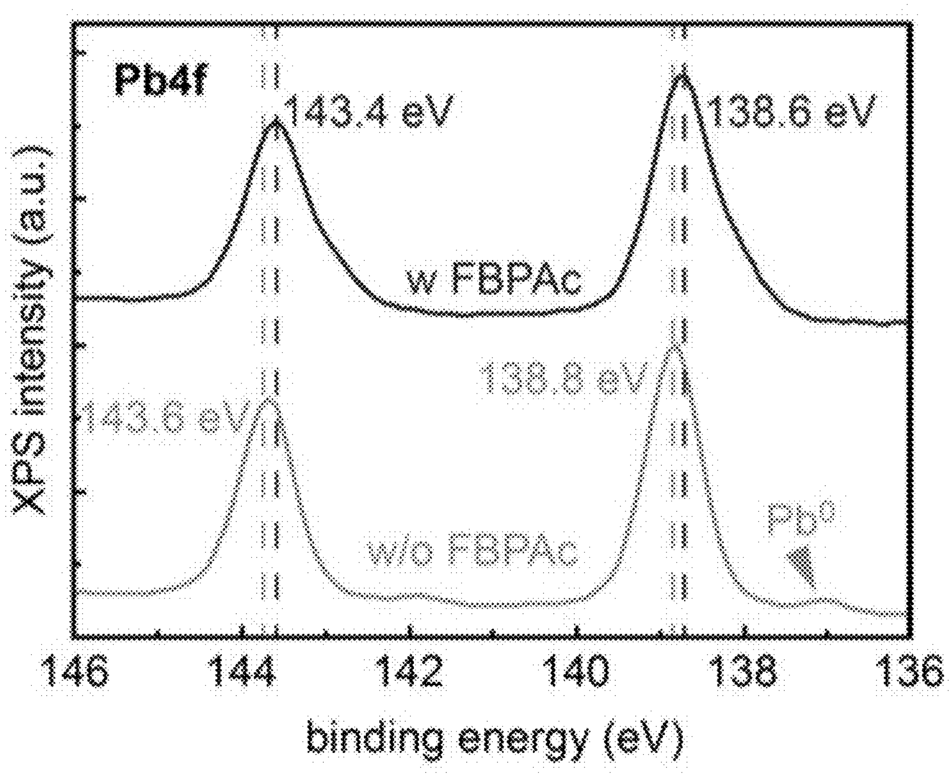
FIG. 3 is a graph of XPS intensity vs binding energy for perovskite films produced with and without FBPAc additive.
Figure 4:
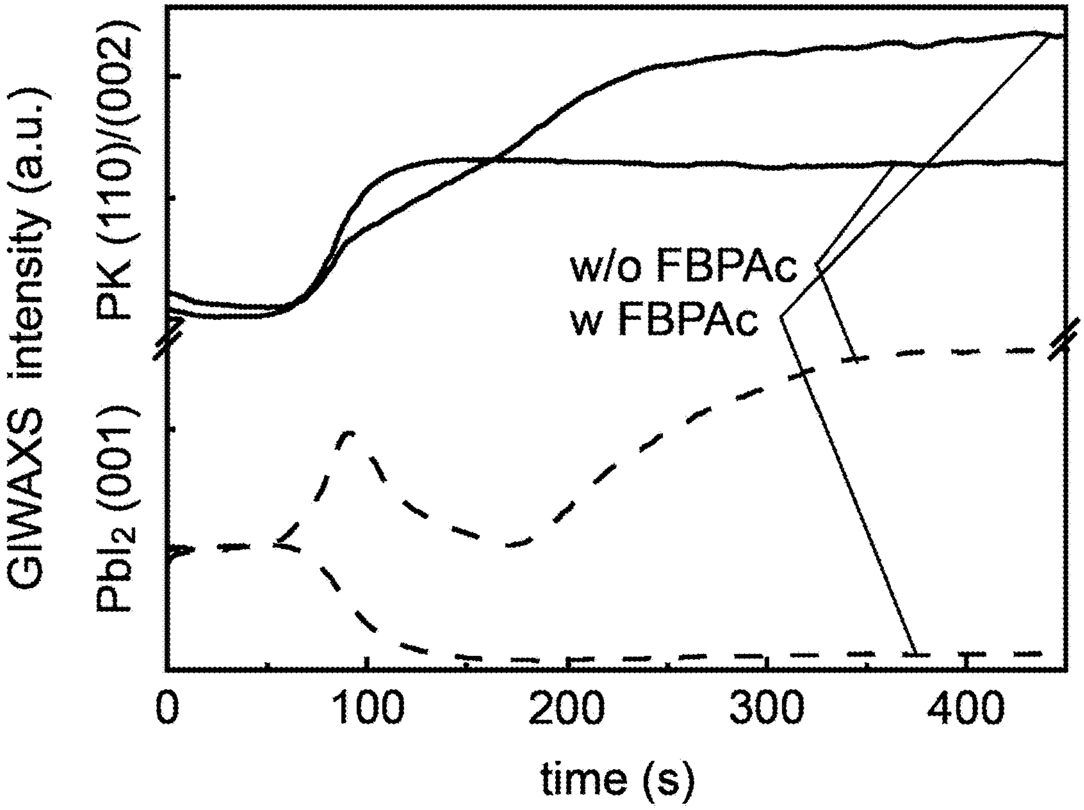
FIG. 4 is a graph of grazing incidence wide angle X-ray scattering data showing the evolutions of the (002)/(110) and (001) reflections of the perovskite and $PbI_2$ phases, respectively, during the perovskite crystallization process.

FIG. 2 is a graph of quasi Fermi-level splitting (QFLS) of bare perovskite layers deposited on glass, on a spiro-TTB HTL 7, on a TaTm HTL 7, and on a Me-4PACz HTL 7 (labelled as HTL losses, empty diamonds), both with and without FBPAc additive during solution deposition of the perovskite layer 9, and both with and without a C60 ETL 11 on the perovskite layer (indicated as HTL+ETL losses, filled diamonds). The data is extracted from photoluminescence quantum yield (PLQY) data. This graph clearly shows that QFLS remains substantially constant when incorporating an FBPAc additive. With the presence of an HTL 7, the addition of FBPAc increases the PLQY with all three types of HTL 7. Overall, QFLS losses are highest on spiro-TTB (−45 to −80 meV compared to the glass/perovskite reference), followed by TaTm (−40 to −65 meV), and lowest on Me-4PACz (−10 to −25 meV). This suggests a better interface quality with Me-4PACz. Without FBPAc, the addition of the C60 ETL 11 on the perovskite leads to significant losses in QFLS (−50 to 100 mV) due to the formation of trap states in the first nm of C60. On the other hand, the incorporation of FBPAc in the perovskite film synthesis mitigates a significant fraction of these losses (+100 mV compared to without FBPAc). X-ray photoelectron spectroscopy (XPS) indicates that this gain in QFLS likely results from an absence of $Pb^0$ surface defects and a shift of the Pb 4*f* edges when using FBPAc, as shown in the graph of FIG. 3. These observations suggest that undercoordinated $Pb^{2+}$ ions coordinate with the phosphonic group of FBPAc. X-ray diffraction of FIG. 4 patterns indicate that FBPAc decreases the fraction of PbI2 crystalline phases left at the end of the crystallization process, as shown on FIG. 4.

Starting from a $CsBr/PbI_2$ template 9*a* freshly spin-coated with FAI/FABr, grazing-incident wide-angle X-ray scattering (GIWAXS) was performed in situ at 150° C. to understand the impact of FBPAc on the perovskite crystallization process. While the crystallization onset of the perovskite (110) and (002) (q~10.1 $nm^{-1}$) planes is similar with or without the additive, FBPAc then slows down the perovskite crystallization after 100 s at 150° C., as showed in FIG. 4. While proceeding initially with a slower rate, the intensity of these perovskite reflections continues to increase throughout the experiment up to ~400 s, an effect not observed without the additive, in which case the peak intensity stabilizes after 150 s at a lower value. This modification of the crystallization pathway by FBPAc results in a more efficient conversion of the $CsBr/PbI_2$ template to a perovskite phase when using FBPAc. Overall, this difference in crystallization kinetics likely originates from the interaction between Pb and FBPAc.

Figure 5:
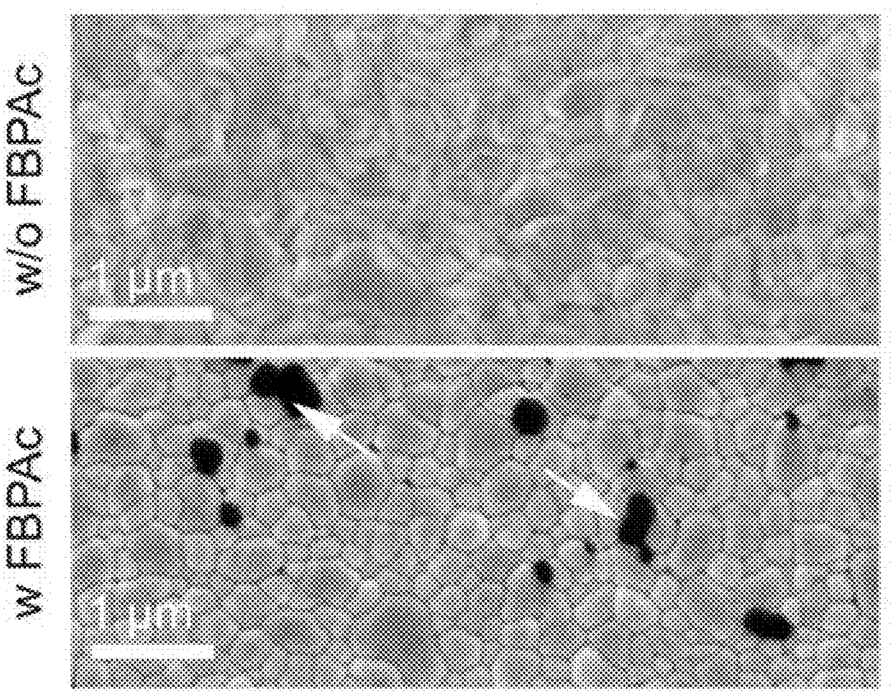
FIG. 5 is a pair of scanning electron microscopy images highlighting the difference in surface morphologies when adding FBPAc additive, with arrows showing additive clusters.
Figure 6:
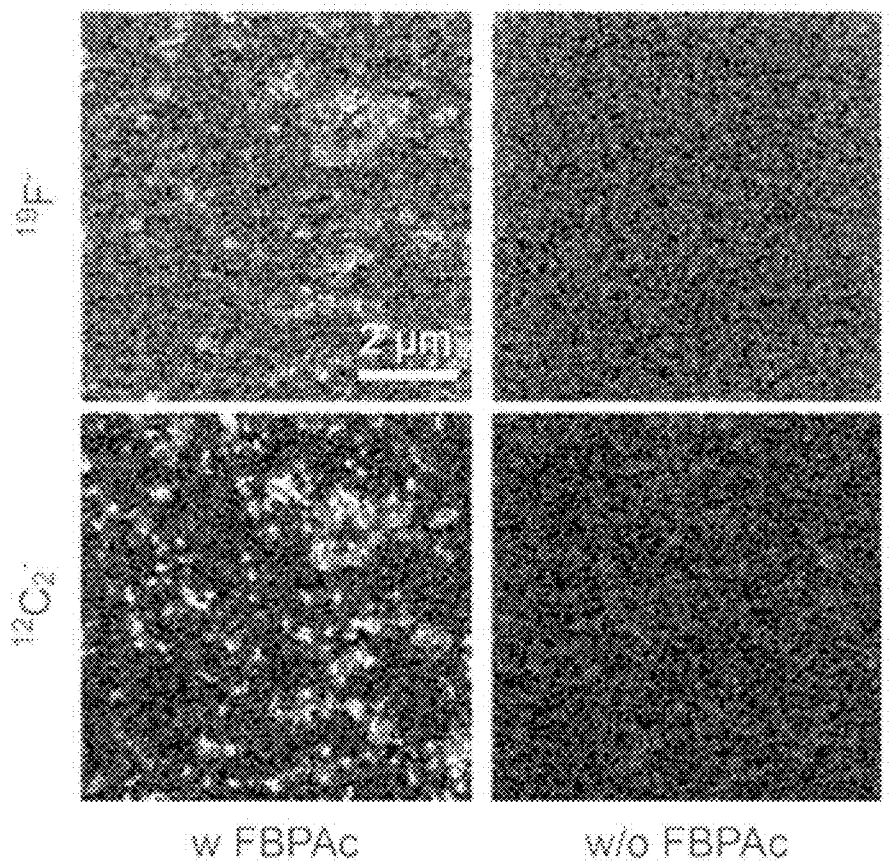
FIG. 6 is four secondary ion mass spectroscopy maps of the $19F^-$ and $12C_2^-$ signals, confirming the presence of FBPAc additive in the form of clusters on the surface of the perovskite layer.

This difference in formation pathway results in films with larger, more monolithic perovskite domains with the additive, as shown by scanning electron microscopy, as illustrated in FIG. 5, in which sub-micrometer black regions are observed on perovskite films featuring FBPAc. From gas field ion source microscopy coupled with secondary ion mass spectroscopy (FIG. 6), these clusters are rich in F and C and hence indicative of the presence of FBPAc on the perovskite surface, in line with XPS results. On the other hand, films processed without FBPAc do not show any clustering and feature a lower amount of F and C on their surface. FBPAc segregates on the perovskite surface where it coordinates with Pb-related defects (FIG. 3).

Figure 7:
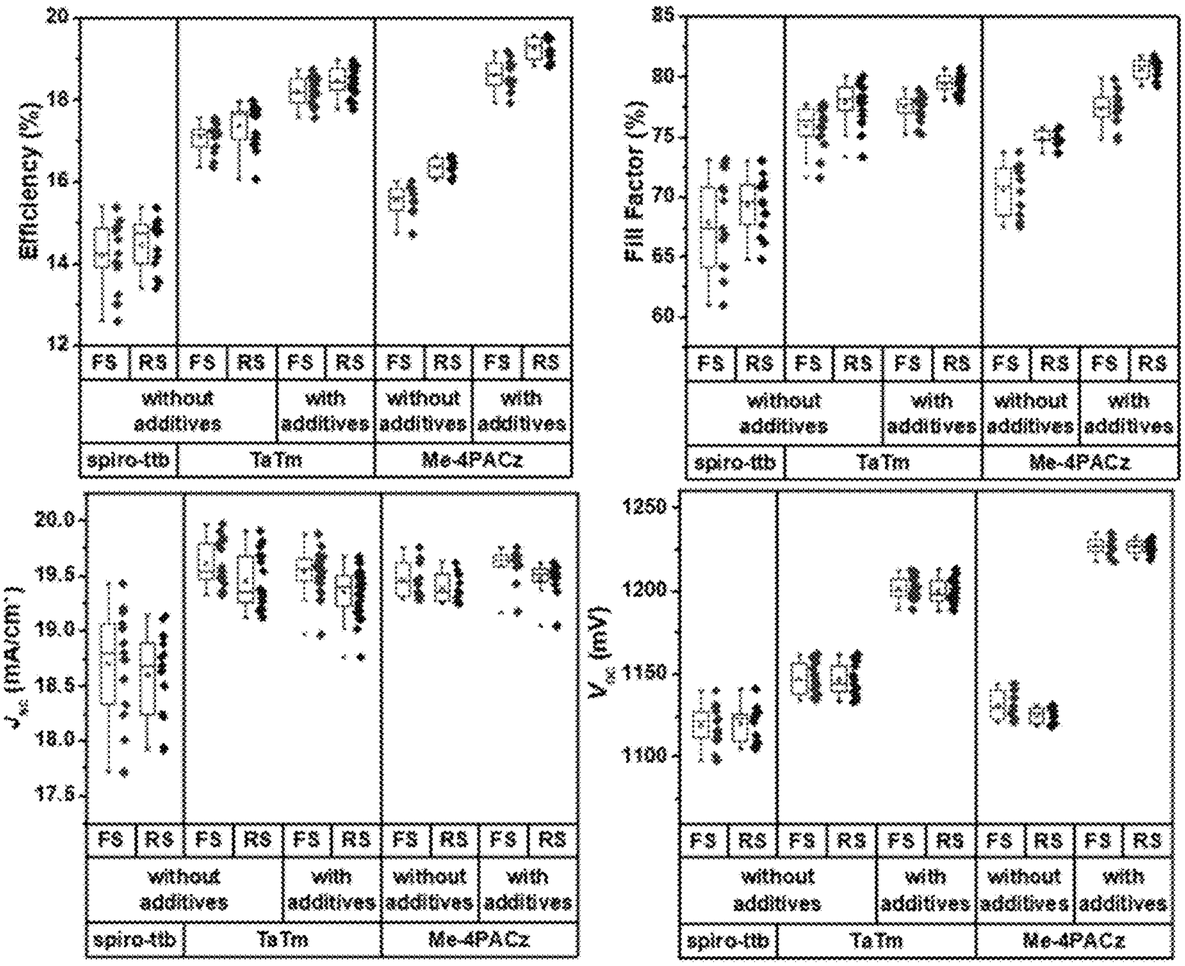
FIG. 7 is four graph illustrating performance metrics for solar cells produced with and without FBPAc additive and with various types of hole transport layer materials.
Figure 8:
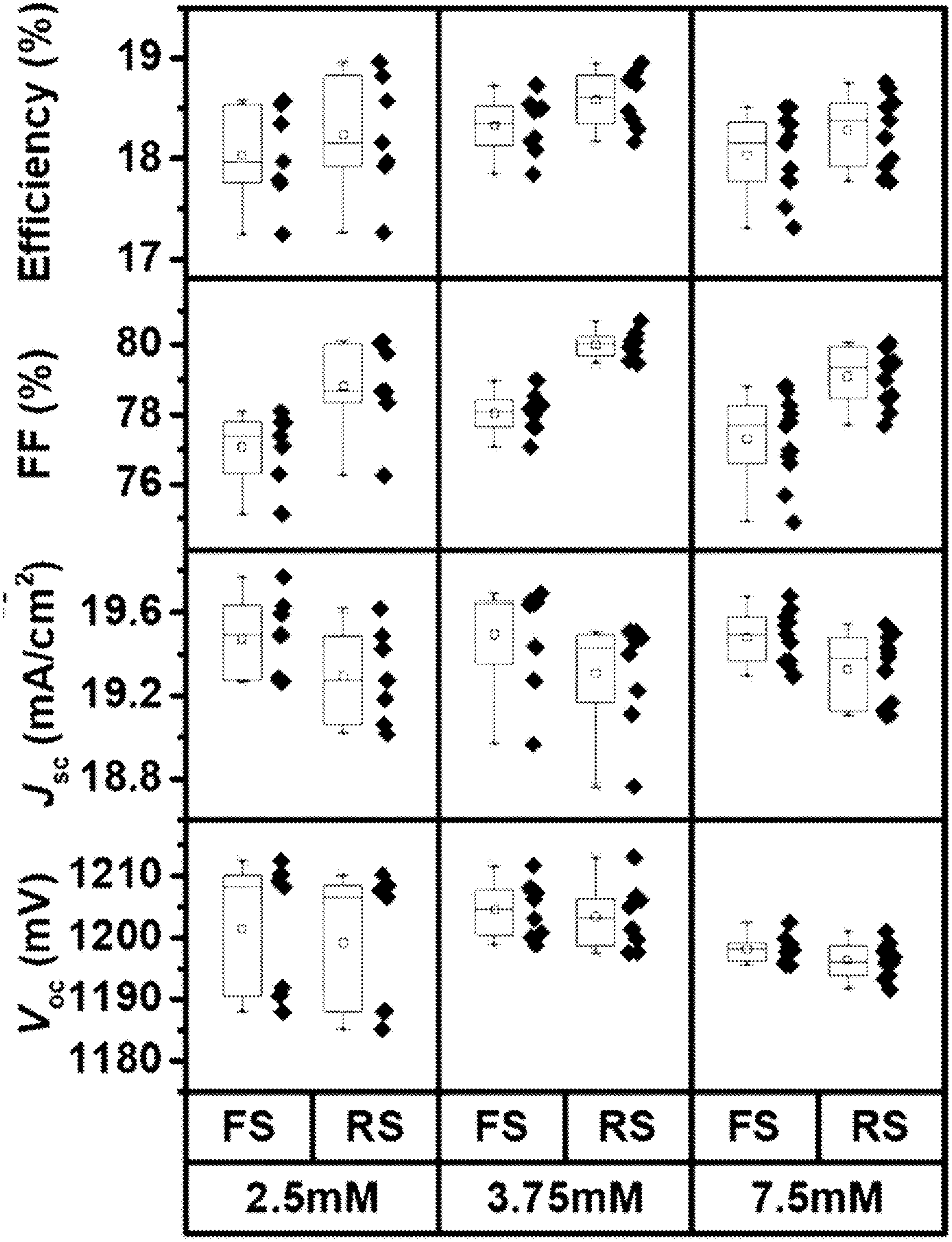
FIG. 8 is graphs illustrating that the concentration of FBPAc additive has little impact on performance metrics on a solar cell using Me-4PACz as hole transport layer.
Figure 9:
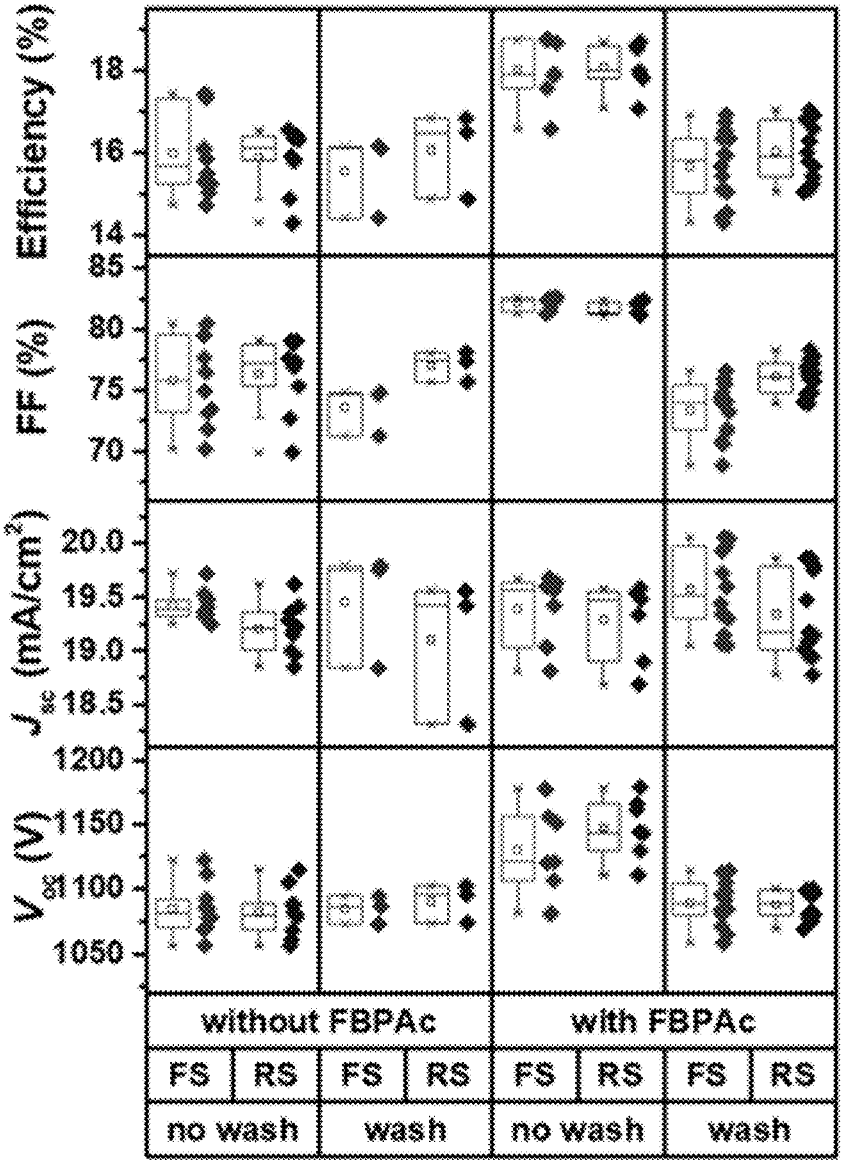
FIG. 9 is graphs illustrating results obtained by washing the perovskite layer in a solvent which removes FBPAc clusters, thereby proving that it is indeed the presence of the additive which obtains the improvements reported.

Perovskite films were then included in 0.25-$cm^2$ glass/ITO/HTL/perovskite/$C_{60}$/BCP(or $SnO_2$)/Cu (or Ag) single junctions to validate with current-voltage (J-V) measurements the improvements induced by FBPAc. As shown in FIG. 7 (where FS indicates "forward scan" and RS indicates "reverse scan"), the open circuit voltage ($V_{oc}$) of the devices improves by 20-30 mV when switching from spiro-TTB to TaTm and Me-4PACz, and by 40-50 mV extra when adding FBPAc. The corresponding fill factor (FF) also increases on average from ~69% to ~76% when changing the HTL 7 and then to ~78-81% with the additive. Overall, the combination of Me-4PACz and FBPAc results in a power conversion efficiency (PCE) of up to 19.5%. Varying the concentration of FBPAc from 2.5 mM to 7.5 mM in the FABr:FAl solution does not affect the performance significantly with a HTL 7 made of Me-4PACz, as shown in FIG. 8. Washing the FBPAc islands with a gentle solvent system (cyclohexane and tert-amyl alcohol) to dissolve and remove the FBPAc without otherwise affecting the perovskite layer 9 results in perovskite cells with a similar $V_{oc}$ to that of untreated films, hence highlighting that FBPAc is impacting primarily the recombination at the perovskite top surface and obtaining the improved cell performance, as shown in FIG. 9.

The perovskite deposition conditions were then adapted to produce 1-$cm^2$ tandem solar cells on silicon heterojunction (SHJ) bottom cells serving as base layers 3 featuring pyramids of 2-3 μm height on both sides and a recombination junction on the front side. Perovskite layer 9 was made thicker (from ~400 nm in single-junctions to ~1 μm) to reach current matching conditions in a tandem with Si with a perovskite Eg of ~1.7 eV. For that purpose, a $CsBr/PbI_2$ template of 660 nm thickness was deposited and the spin coating parameters were adapted accordingly. The front electrode was made transparent by switching to a stack made of C60 (layer 11), SnOx (lower part of layer 13), indium zinc oxide (IZO) (upper part of layer 13), a Ag grid (layer 15), and a MgF2 antireflective coating (layer 17). A $V_{oc}$ of 1.9V could be obtained with either TaTM or Me-4PACz, in line with single-junction and QFLS data. The FF of TaTm-based tandems was however significantly lower than with Me-4PACz (<70% compared to >75%), likely as a result of the low hole mobility in undoped TaTm. The impact of a slight change in the perovskite was investigated by changing the FABr:FAl molar ratio from 2, 1.75 and to 1.5. A PCE>30% could be achieved with different perovskite compositions, with slight variations in $V_{oc}$ $J_{sc}$ and FF depending on the top cell and the current-limiting sub-cell.

A tandem cell 1 as described above featuring Me-4PACz as HTL 7 and FBPAc as additive in the perovskite precursor solution was sent to the National Renewable Energy Laboratory (NREL) for certification. This tandem was slightly top-cell limited and both sub-cells produced a $J_{sc}$>20 mA/cm$^2$. The stabilized J-V properties of the device were measured using the asymptotic maximum power (Pmax) scan method in standard test conditions (STC, 25° C., 1000 W/m2, AM1.5G spectrum). The cell reached a $V_{oc}$ of 1.91 V, a $J_{sc}$ of 20.47 mA/cm2 and a FF of 79.8%, which resulted in a certified PCE of 31.25% (with an aperture area of 1.1677 cm2).

As can be seen from the foregoing, the method of the invention improves the crystallinity of the perovskite layer 9, which increases the fill factor of the solar cell 1 due to mitigation of charge transport losses within the perovskite layer since the resulting larger grain structure results in fewer grain boundaries along the travel direction of the charge carriers (i.e. perpendicular to the plane of the perovskite layer 9), increasing the cell efficiency.

The additive passivates the Pb-related defects present at the top surface of the perovskite layer 9 by coordinating with them on this surface, which increases the open circuit voltage of the solar cell 1 while still enabling charge carrier extraction, further increasing the cell efficiency.

Since these technical effects are obtained simply by use of an additive in the perovskite precursor solution, no extra manufacturing steps are necessary and the invention can be applied in a standard fabrication process flow, which is extremely interesting from an industrial perspective.

Finally, the approach of the invention is versatile and can be implemented in single-junction opaque cells, single-junction semi-transparent cells, and in tandem cells.

Although the invention has been described in terms of specific embodiments, variations thereto are possible without departing from the scope of protection defined by the appended claims.

The invention claimed is:

1. A method of manufacturing a solar cell, comprising steps of:

providing a substrate;

providing a first layer of transparent conductive oxide on said substrate;

providing a first charge transport layer on said first layer of transparent conductive oxide;

providing a perovskite-based light-absorber layer on said first charge transport layer;

providing a second charge transport layer on said perovskite-based light absorber layer;

providing a second layer of transparent conductive oxide on said second charge transport layer;

providing a patterned metallic contact layer on said second layer of transparent conductive oxide;

wherein said step of providing a perovskite-based light absorber layer comprises:

providing a perovskite precursor solution comprising an additive comprising an organic phosphonic acid and/or a phosphonate salt in a concentration of between 0.1 mMol and 50 mMol;

applying said perovskite precursor solution upon said first charge transport layer;

annealing said perovskite layer at a temperature between 100° C. and 170° C.

2. The method according to claim 1, wherein said first charge transport layer is a hole selective layer comprising at least one of:

2,2',7,7'-Tetra(N, N-di-p-tolyl)amino-9,9-spirobifluorene;

1,3,4,6-Tetra-O-acetyl-2-O-(trifluoromethanesulfonyl)-beta-D-mannopyranose;

3,6-dimethyl-9H-carbazol-9-yl)butyl]phosphonic acid;

[2-(3,6-dimethoxy-9H-carbazol-9-yl)ethyl]phosphonic acid;

[2-(9H-carbazol-9-yl)ethyl]phosphonic acid.

3. The method according to claim 1, wherein said second charge transport layer comprises C60.

4. The method according to claim 1, wherein said additive comprises one or more of:

2, 3, 4, 5,6-pentafluorobenzylphosphonic acid;

benzylphosphonic acid, 4-bromobenzylphosphonic acid, 4-fluorobenzylphosphonic acid, (4-chlorophenyl)phosphonic acid, phenylphosphonic acid.

5. The method according to claim 1, wherein said perovskite-based light-absorber layer has a thickness between 200 nm and 2000 nm.

6. The method according to claim 1, wherein said perovskite-based light absorber layer comprises (Cs, FA, MA)Pb$(I,Br,Cl)_3$ or (Cs, FA)Pb$(I,Br,Cl)_3$.

7. The method according to claim 1, wherein said perovskite precursor solution comprises organic and inorganic perovskite precursors and is applied directly to said first charge transport layer.

8. The method according to claim 7, wherein said substrate has a roughness of less than 1 μm Ra on a surface facing said perovskite-based light absorber layer.

9. The method according to claim 1, wherein said step of providing a perovskite-based light absorber layer comprises a step of vapor depositing a layer of CsX and/or $PbX_2$, where X is I, Br, Cl, on said first charge transport layer followed by said step of applying said perovskite precursor solution.

10. The method according to claim 9, wherein said perovskite precursor solution comprises organic perovskite precursors.

11. The method according to claim 9, wherein said substrate has a roughness of 0 μm to 10 μm Ra on a surface facing said perovskite-based light absorber layer.

12. The method according to claim 1, wherein said substrate is one of:

an opaque support;

a transparent support;

a silicon solar cell.

13. A solar cell obtained or obtainable by the method of claim 1.

* * * * *